Figure 1:
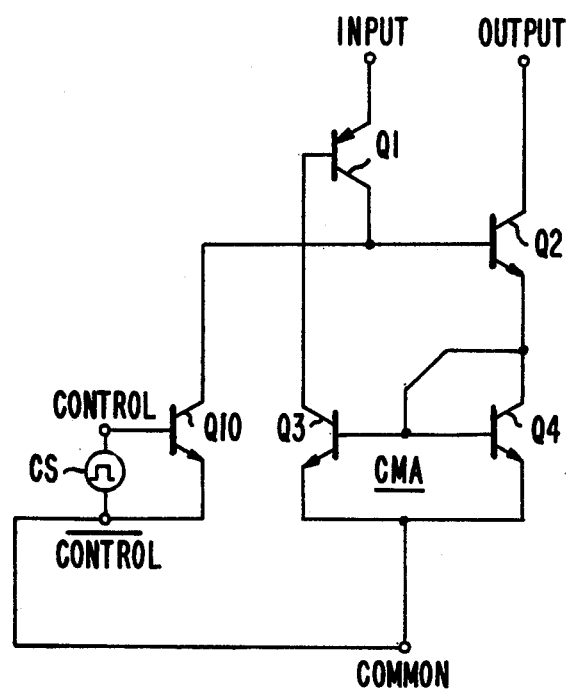

United States Patent [19]
Limberg

[11] 4,103,246
[45] Jul. 25, 1978

[54] SWITCHABLE CURRENT AMPLIFIER

[75] Inventor: Allen LeRoy Limberg, Lambertville, N.J.

[73] Assignee: RCA Corporation, New York, N.Y.

[21] Appl. No.: 830,916

[22] Filed: Sep. 6, 1977

[51] Int. Cl.$^2$ .................................................. H03G 3/30
[52] U.S. Cl. ................................... 330/278; 307/255; 307/297; 330/288
[58] Field of Search ............... 330/278, 288; 307/255, 307/296, 297; 323/4

[56] References Cited
U.S. PATENT DOCUMENTS 3,900,750   8/1975   Ohsawa ........................... 307/297 X

*Primary Examiner*—James B. Mullins
*Attorney, Agent, or Firm*—H. Christoffersen; A. L. R. Limberg

[57] ABSTRACT

A switchable current amplifier comprising first and second transistors of complementary conductivity type, an input terminal connected to the emitter electrode of the first transistor, an output terminal to which the collector electrode of the second transistor connects, an inverting current amplifier having an input connection to which the emitter electrode of the second transistor connects and having an output connection to the base electrode of the first transistor. A control circuit is connected to an interconnection between the collector electrode of the first transistor and the base electrode of the second transistor for selectively diverting —in response to a control signal—collector current flow from said first transistor away from flowing as base current to the second transistor, thereby selectively disabling current amplification between the input and output terminals.

10 Claims, 4 Drawing Figures

SWITCHABLE CURRENT AMPLIFIER

The present invention relates to switchable current amplifiers of a type having, when enabled, a well-defined current gain as determined by the ratio between the collector current versus emitter-to-base voltage characteristics of a pair of transistors and having, when disabled, substantially zero output current response to applied input current.

The present invention is embodied in a switchable current amplifier comprising first and second transistors of complementary conductivity type, an input terminal connected to the emitter electrode of the first transistor, an output terminal to which the collector electrode of the second transistor connects, an inverting current amplifier having an input connection to which the emitter electrode of the second transistor connects and having an output connection to the base electrode of the first transistor. Means are connected to an interconnection between the collector electrode of the first transistor and the base electrode of the second transistor for selectively diverting—in response to a control signal—collector current flow from said first transistor away from flowing as base current to the second transistor, thereby selectively disabling current amplification between the input and output terminals.

In the drawing:

each of FIGS. 1–4 is a schematic diagram of a switchable current amplifier embodying the present invention.

In the switched current amplifier of FIG. 1, input current applied to the emitter electrode of PNP transistor Q1 via input terminal IN is, absent conduction by NPN transistor Q10, coupled by the common-base amplifier action of Q1 to the base electrode of NPN transistor Q2 to draw it into conduction. The resultant emitter current of Q2 is larger by a factor $(h_{feQ2} + 1)$ than its base current, where $h_{feQ2}$ is the common-emitter base-to-collector current gain (or beta) of Q2. This emitter current is applied to the input connection of a simple current mirror amplifier configuration (CMA) comprising NPN transistor Q3 and the self-biased NPN transistor Q4 parallelling the base-emitter junction of Q3. Transistors Q1, Q2, Q3 and Q4 may be monolithically integrated, such construction lending itself, as is well-known, to the use of current mirror amplifier configurations. The emitter electrode of Q2 is connected to the common terminal COMMON of the switched current amplifier by the input circuit of this simple current mirror amplifier configuration CMA. The output connection of CMA is at the collector electrode of Q3, and the current demanded as collector current for Q3 at this output connection is larger than the current flow through the input circuit of CMA by a factor $-G$, where G is the ratio of the collector current versus emitter-to-base potential characteristic of Q3 to that of Q4. Where Q3 and Q4 have the same diffusion or implantation profiles, G will be the ratio of the effective area of the base-emitter junction of Q3 divided by that of Q4. The collector current demand of Q3 applies forward bias current to the base of Q1, completing a regenerative feedback loop that stabilizes by keeping Q1 in saturation, reducing its common-base emitter-to-collector current gain (or alpha) to $1/[(h_{feQ2}+1)G]$. Substantially all the applied input current flows as the collector current of Q3 under equilibrium conditions. A current substantially equal to $1/G$ times the input current has to be supplied to the input connection of CMA to support substantially all the input current flowing through its output connection. The flow of this current from the emitter of Q2 is accompanied by a flow of current to its collector substantially as large and, therefore, also substantially equal to $1/G$ times the input current in amplitude.

The operation as thus far described is that of the current amplifier when enabled and presupposes Q10 to be non-conductive. In such circumstances, the source CS of control signals supplies a control signal between the terminals $\overline{\text{CONTROL}}$ and CONTROL at the emitter and base electrodes, respectively, of Q10 which is zero-valued or otherwise less than the value required to forward-bias the base-emitter junction of Q10 and render Q10 conductive.

Responsive to source CS supplying a control signal that biases Q10 into conduction, Q10 clamps the base of Q2 close to the potential at the COMMON terminal of the switched current amplifier, supposing the $\overline{\text{CONTROL}}$ and COMMON terminals to be connected, as shown. There is insufficient potential between the base of Q2 and the COMMON terminal to forward-bias the base-emitter junction of Q2 as well as those of Q3 and Q4 that provide Q2 its emitter loading, so Q2 refuses to accept base current. The collector current of Q1 flowing in response to input current applied via the input terminal IN to its emitter electrode, owing to common-base amplifier action of Q1, flows instead through the collector-to-emitter path of Q10. With no base current to support collector current flow, Q2 demands no current at the output terminal OUT, and the switchable current amplifier of FIG. 1 is disabled from acting as a current amplifier between its input and output terminals IN and OUT.

Armed with the foregoing disclosure many alternative configurations will suggest themselves to one skilled in the art of circuit design. The $\overline{\text{CONTROL}}$ terminal may be referred to potentials either negative or slightly positive with regard to the COMMON terminal, for example. As a further example, Q3 and Q4 may be provided emitter degeneration resistances with conductances related in the same ratio as their transconductances, to improve the gain stability of CMA, particularly in non-monolithic constructions.

Figure 2:
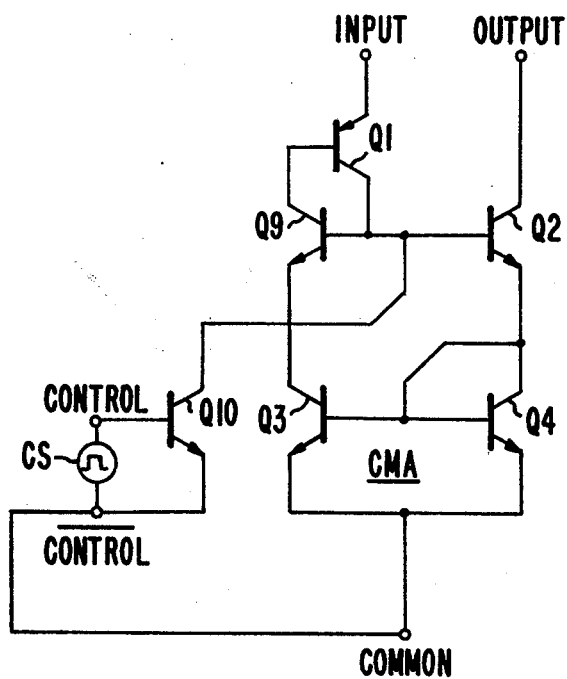

FIG. 2 shows a modification of the FIG. 1 switchable current amplifier in which a common base amplifier NPN transistor Q9 is introduced between the collector of Q3 and the base of Q1. The base of Q9 is biased to the same potential as that of Q2, so the emitter follower actions of Q9 and Q2 place similar collector potentials on Q3 and Q4. The resultant similar emitter-to-collector potentials on Q3 and Q4 improve the tracking of their collector current versus emitter-to-base potential characteristics so the current gain of CMA can be more closely held to predicted value.

Figure 3:
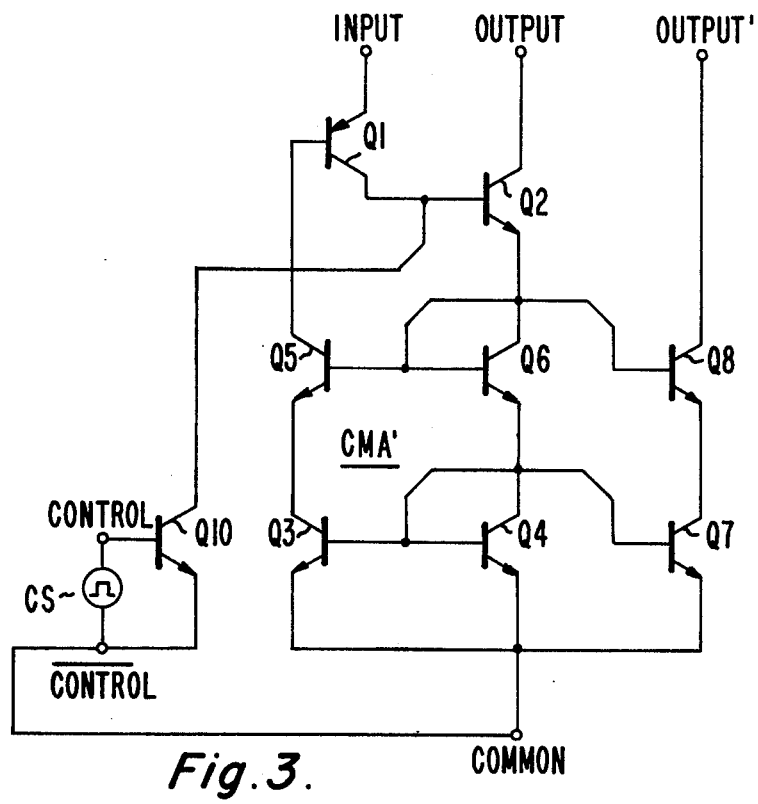

FIG. 3 shows a modification of the FIG. 1 switchable current amplifier in which the single current mirror amplifier configuration CMA is replaced by a more complex current mirror amplifier configuration CMA' comprising NPN transistors Q5 and Q6 in addition to Q3 and Q4, having an input connection at the interconnection of the collector of Q6 and the joined base connections of Q5 and Q6, having an output connection at the collector of Q5, and having a common connection to the terminal COMMON. This type of current mirror amplifier is described in detail in U.S. Pat. No. 3,835,410 issued Sept. 10, 1974 to H. A. Wittlinger, entitled "Current Amplifier" and assigned to RCA Corporation. The input circuit of CMA' includes serially connected, self-biased NPN transistors Q6 and Q4 with the emitter-to-base potential of Q4 required to support the flow of current in this input circuit, as in CMA of FIG. 1, being applied as the emitter-to-base potential of Q3 to generate a collector current −G times as large from Q3. This current is conducted by the common-base amplifier action of NPN transistor Q5 to the base of Q1, Q5 having its base biased relative to the COMMON terminal by the offset potential across the serially connected self-biased transistors Q6 and Q4.

CMA' may, as shown, be a dual-output current mirror amplifier additionally comprising NPN transistors Q7 and Q8 connected analogously to Q3 and Q5, respectively, except that the collector of Q8 is connected to a second output terminal OUT'. The gain of the switchable current amplifier as between its input and output terminals IN and OUT' will be −H/G where H is the ratio of the collector current versus emitter-to-base potential characteristic of Q7 to that of Q4. Where Q7 and Q4 have the same diffusion or implantation profile, H will be defined by the ratio of the effective base-emitter junction area of Q7 to that of Q4. Alternatively, Q7 and Q8 may be omitted where a second output terminal OUT' is not required; or still again, other structures connected like Q7 and Q8 may provide still further output terminals.

Figure 4:
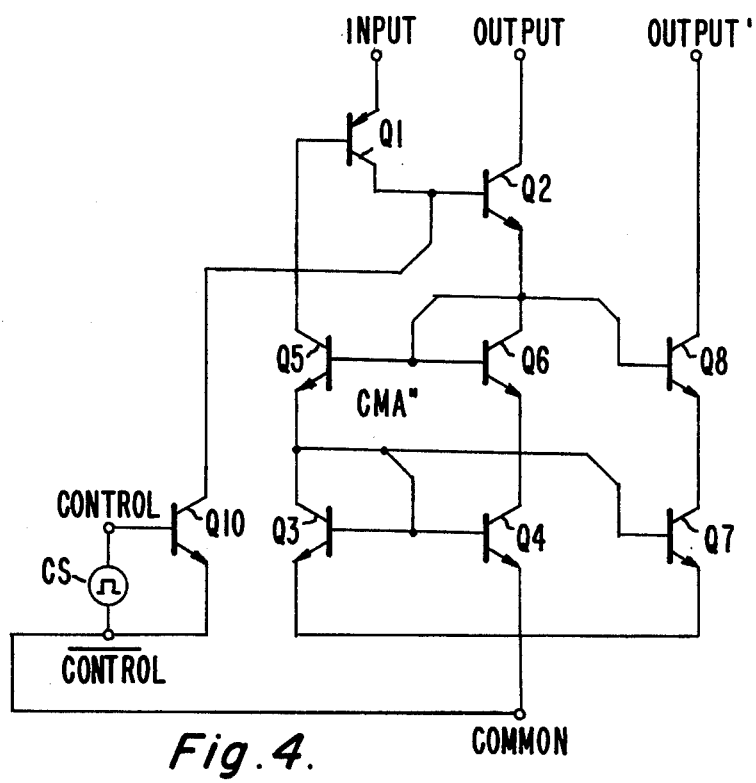

FIG. 4 shows a modification of the FIG. 3 configuration in which CMA' is replaced by a current mirror amplifier CMA". In CMA" the base electrodes of Q3 and Q4 (and Q7, where used) are biased from the collector electrode of Q3 rather than Q4. This type of current mirror amplifier structure is described in greater detail in U.S. Pat. No. 3,852,679 issued Dec. 3, 1974 to O. H. Schade, Jr. entitled "Current Mirror Amplifiers" and assigned to RCA Corporation. CMA" may be modified along the lines described with regard to CMA', eliminating Q7 and Q8 to obtain a single-output current amplifier or replicating their connection to provide a multiple-output current amplifier.

What is claimed is:

1. A switchable current amplifier comprising:
    first and second transistors respectively of first and second complementary conductivity types, each having base and emitter and collector electrodes;
    an input terminal connected to the emitter electrode of said first transistor;
    an output terminal to which the collector electrode of said second transistor connects;
    an inverting current amplifier having an input connection to the emitter electrode of said second transistor and having an output connection to the base electrode of said first transistor;
    a source of control signals; and
    means connected to an interconnection between the collector electrode of said first transistor and the base electrode of said second transistor for selectively diverting, responsive to a control signal from said source, collector current flow from said first transistor away from flowing as base current to said second transistor.

2. A switchable current amplifier as set forth in claim 1 wherein said inverting current amplifier is a current mirror amplifier.

3. A switchable current amplifier as set forth in claim 1 including a common terminal, wherein said inverting current amplifier includes:
    third and fourth transistors of said second conductivity type having respective collector electrodes connected respectively to the base electrode of said first transistor and to the emitter electrode of said second transistor, having respective emitter electrodes connected to said common terminal, and having respective base electrodes to each of which the emitter electrode of said second transistor is direct-coupled.

4. A switchable current amplifier as set forth in claim 3 wherein the collector electrode of said third transistor is connected to the base electrode of said first transistor by means of a further transistor in common-base amplifier configuration, having an emitter electrode to which the collector electrode of said third transistor connects, having a base electrode connected to the interconnection between the collector electrode of said first transistor and the base electrode of said second transistor, and having a collector electrode connected to the base electrode of said first transistor.

5. A switchable current amplifier as set forth in claim 1 including a common terminal, wherein said inverting current amplifier includes:
    third, fourth, fifth and sixth transistors of said second conductivity type, each having base and emitter and collector electrodes, the respective emitter electrodes of said third and fourth transistors being connected to said common terminal, the emitter electrode of said fifth transistor being connected to the collector electrode of said third transistor, the emitter electrode of said sixth transistor being connected to the collector electrode of said fourth transistor and direct-coupled to the base electrodes of said third and fourth transistors, the emitter electrode of said second transistor being connected to the collector electrode of said sixth transistor and direct-coupled to the base electrodes of said fifth and sixth transistors, and the collector electrode of said fifth transistor being connected to the base electrode of said first transistor.

6. A switchable current amplifier as set forth in claim 5 including:
    a further output terminal;
    a seventh transistor of said second conductivity type, having a base electrode to which the emitter electrode of said sixth transistor is direct-coupled, having an emitter electrode connected to said common terminal, and having a collector electrode; and
    an eighth transistor of said second conductivity type, having a base electrode to which the emitter electrode of said second transistor is direct coupled, having an emitter electrode connected to the collector electrode of said seventh transistor, and having a collector electrode connected to said further output terminal.

7. A switchable current amplifier as set forth in claim 1 including a common terminal, wherein said inverting amplifier includes:
    third, fourth and fifth transistors of said second conductivity type, each having base and emitter and collector electrodes, the respective emitter electrodes of said third and fourth transistors being connected to said common terminal, the emitter electrode of said second transistor being direct-coupled to the base electrode of said fifth transistor, the collector electrode of said fifth transistor being connected to the base electrode of said first transistor, the emitter electrode of said fifth transistor having the collector electrode of said third transistor connected thereto and being direct-coupled to the base electrodes of said third and fourth transistors; and means connecting the collector electrode of said fourth transistor to the emitter electrode of said second transistor.

8. A switchable current amplifier as set forth in claim 7 wherein said means connecting the collector electrode of said fourth transistor to the emitter electrode of said second transistor is a self-biased sixth transistor.

9. A switchable current amplifier as set forth in claim 7 including:
 a further output terminal;
 a further transistor of said second conductivity type, having a base electrode to which the emitter electrode of said fifth transistor is direct-coupled, having an emitter electrode connected to said common terminal, and having a collector electrode; and
 a still further transistor of said second conductivity type, having a base electrode to which the emitter electrode of said second transistor is direct-coupled, having an emitter electrode to which the collector electrode of said further transistor is connected, and having a collector electrode connected to said further output terminal.

10. A switchable current amplifier as set forth in claim 1 wherein said means for selectively diverting includes a further transistor of said second conductivity type having base and emitter electrodes between which said control signal is applied and having a collector electrode connected to the interconnection between the collector electrode of said first transistor and the base electrode of said second transistor.

* * * * *